United States Patent [19]

Bader et al.

[11] Patent Number: 4,764,900
[45] Date of Patent: Aug. 16, 1988

[54] HIGH SPEED WRITE TECHNIQUE FOR A MEMORY

[75] Inventors: Mark Bader; Karl L. Wang, both of Austin, Tex.

[73] Assignee: Motorola, Inc., Schaumburg, Ill.

[21] Appl. No.: 843,460

[22] Filed: Mar. 24, 1986

[51] Int. Cl.⁴ .............................................. G11C 7/00
[52] U.S. Cl. ..................................... 365/189; 365/230
[58] Field of Search .................... 365/189, 190, 230

[56] References Cited

U.S. PATENT DOCUMENTS 4,616,343 10/1986 Ogawa ................................. 365/203
4,618,946 10/1986 Little et al. ......................... 365/230
4,642,798 2/1987 Rao ..................................... 365/230

Primary Examiner—James W. Moffitt
Attorney, Agent, or Firm—John A. Fisher; Jeffrey Van Myers; James L. Clingan, Jr.

[57] ABSTRACT

In a random access memory a write driver develops a full rail write signal which is coupled to the selected bit line pair via transmission gates. The bit lines are thus driven to full rail. This results in a faster rise time on the bit line which is driven to a logic high. With the faster rise time, the selected cell is written into more quickly with the result of a faster write time for the memory.

7 Claims, 5 Drawing Sheets

4,764,900

HIGH SPEED WRITE TECHNIQUE FOR A MEMORY

FIELD OF THE INVENTION

The present invention relates to memories which have a read mode and a write mode, and more particularly to memories in which high speed writing is desirable.

BACKGROUND OF THE INVENTION

In static random access memories (SRAMs), there has been an increased need for high speed writing as reading has gotten increasingly faster. With precharging and equalization techniques triggered from address transitions becoming common, access times have been further enhanced. As the read access times have become faster, the need for a faster write has become more significant. Write drivers have typically been push-pull N channel transistors which take advantage of the higher mobility of N channel devices which results in higher gain for a given device size. To increase write speed, the device sizes can simply be increased. Increasing the device size not only increases chip area, but also increases power consumption. With CMOS technology, power consumption can be quite low so that simply increasing the device size to increase speed can result in consuming more power than is desirable.

SUMMARY OF THE INVENTION

An object of the present invention is to provide an improved write technique in a memory.

Another object of the invention is to provide a memory with improved writing speed.

Yet another object of the invention is to provide a an improved write driver in a memory.

These and other objects are achieved in a memory having a plurality of memory cells, a column decoder, a write driver circuit, and a coupling circuit. The memory has a write mode in which data is written into a selected memory cell via a selected bit line pair and a read mode in which data is read from a selected bit line pair. The plurality of memory cells are coupled to word lines and bit line pairs at intersections thereof. Each memory cell receives data from or provides data to the bit line pair to which it is coupled when the word line to which it is coupled is enabled. The column decoder couples a selected bit line pair to a data line pair as determined by a column address. The write driver circuit is coupled between a first power supply terminal and the second power supply terminal. The write driver circuit provides, in response to the memory switching to the write mode, a first write signal at a voltage present at the first power supply terminal and a second write signal at a voltage present at the second power supply terminal in response to a data input signal being in a first logic state. The coupling circuit is coupled between the write driver means and the data lines. The coupling circuit couples the first write signal to a first data line of the data line pair at the voltage present on the first power supply terminal and couples the second write signal to a second data line of the data line pair at the voltage present on the second power supply terminal.

DESCRIPTION OF THE INVENTION

Figure 1:
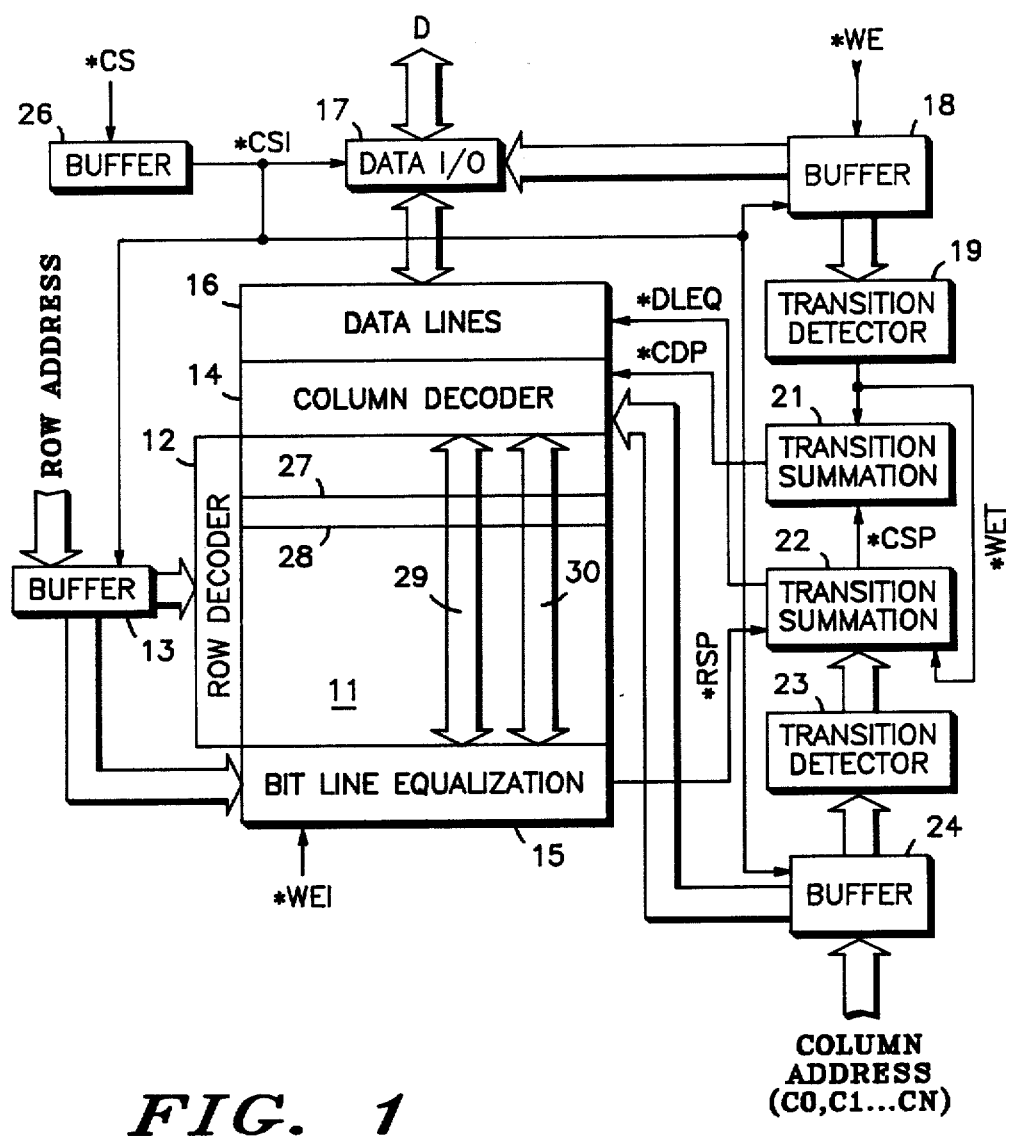
FIG. 1 is a block diagram of the invention according to a preferred embodiment of the invention.

Shown in FIG. 1 is a static random access memory (SRAM) 10 comprised generally of an array 11, a row decoder 12, a row address buffer 13, a column decoder 14, a bit line equalization circuit 15, data lines 16, a data I/0 circuit 17, a write enable buffer 18, a write enable transition detector 19, a transition summation circuit 21, a transition summation circuit 22, a column address transition detector 23, a column address buffer 24, and a chip select buffer 26. Array 11 is comprised of SRAM cells located at intersections of word lines and bit line pairs. Word lines 27 and 28 and bit line pairs 29 and 30 are shown in FIG. 1. Buffer 26 receives a chip select signal *CS and provides an internal chip select signal *CSI in response thereto. The asterisk (*) before a signal indicates that the signal is active at a logic low. In the case of signal *CS, memory 10 is selected when signal *CS is a logic low and deselected when signal *CS is a logic high. Data I/0 circuit 17 either receives or provides a data signal D. Signal D, in a x1 memory, is a single signal. Signal D, in a by x4 or x8, memory can be more. For example, 4 or 8 bit line pairs can be selected for a single column address so that data signal D could be 4 or 8 signals respectively. Buffer 18 receives a write enable signal *WE and provides an internal write enable signal *WEI to bit line equalization circuit 15 and several other write enable derived signals to data I/0 17 in response to write enable signal *WE. When signal *WE is a logic high, memory 10 is in a read mode. When signal *WE is a logic low, memory 10 is in a write mode. Data I/0 circuit provides data signal D as an output when memory 10 is in the read mode and receives signal D as an input when memory 10 is in the write mode. Column decoder 14 is connected to the bit line pairs of array 11. Data lines 16 are comprised of 4 data line pairs and circuitry for equalizing the data line pairs. The data line pairs of data lines 16 are connected to column decoder 14. Row decoder 12 is connected to the word lines of array 11.

Transition detector 19 is connected to buffer 18 and provides a signal *WET as a logic low pulse in response to a logic low to logic high transition of write enable signal *WE. Transition detector 23 is connected to buffer 24 and detects a transition of the column address. The column address is comprised of a plurality of column address signals. Column address signals C0, C1, and CN are shown in FIG. 1. Transition detector 23 provides a corresponding output to transition summation circuit 22 for each of the column address signals which comprise the column address. A column address signal pulse is provided on the output of transition detector 23 which corresponds to the column address signal which changed logic states. Consequently, transition summation circuit 22 receives a pulse for each column address signal which changes logic states. Transition summation circuit 22 also receives pulse *WET. Transition summation circuit 22 provides a column summation signal *CSP as a logic low pulse and in response to receiving any column address signal pulse or pulse *WET and a data line equalization signal *DLEQ as a logic low pulse in response to receiving any column address signal pulse, a row address transition summation signal *RSP at a logic low, or pulse *WET. Signal *RSP is provided as a logic low pulse by bit line equalization circuit 15 in response to a row address transition. Transition summation circuit 21 functions as an AND gate having inputs for receiving pulses *CSP and *WET and an output for providing a column disable signal *CDP as a logic low pulse in response to an occurrence of either pulse *CSP or *WET or both.

A memory cell located in array 11 is enabled when the word line to which it is connected is enabled. Row decoder 12 is connected to the word lines of array 11 such as word lines 27 and 28. The word line which is selected to be enabled is selected by a row address. Row address buffer 13 receives the row address and couples it in buffered form to row decoder 12. Row decoder 12 decodes the received row address and enables the word line selected thereby. Similarly, column decoder 14 couples selected bit line pairs to data lines 16. In the present embodiment, column decoder 14 couples 4 bit line pairs to corresponding data line pairs of data lines 16 for a particular column address. Each memory cell, as is characteristic of SRAM cells, can either have data written into or read from it. This is achieved via the bit line pair to which the memory cell is coupled. When the word line to which the memory cell is coupled is enabled the contents of the memory are made available to the bit line pair for reading or writing. In the read mode, the enabled memory cell causes the two bit lines of the bit line pair to which it is coupled to separate in voltage. If the bit line pair is selected, this voltage separation is coupled to a data line pair of data lines 16 via column decoder 14, is sensed by a sense amplifier present in data I/0 17, and is subsequently output as part of data signal D. In the write mode, an enabled memory cell may be written into if the bit line pair to which it is coupled is selected. If selected, the bit line pair is polarized in voltage so as to write data into the enabled memory cell. In the write mode, the four data line pairs of data lines 16 are polarized in voltage by data I/0 17 which writes onto these four data line pairs according to received data signal D. A selected bit line pair is written onto by being coupled to one of the polarized data line pairs via column decoder 14. Bit line equalization circuit 15 is responsive to a row address change and in response to the internal write enable signal *WEI and provides for equalization of the bit lines.

Column decoder 14 is disabled in response to pulse *CDP switching to a logic low. Pulse *CDP will typically stay at a logic low for about 10 ns in response to pulse *WET or pulse *CSP. Pulse *CSP will pulse to a logic low in response to any column address change or a change from the write mode to the read mode. In the case of a write to read transition, data I/O must switch from being a data in buffer and a write driver to being a sense amplifier and a data out buffer. This conversion is done in response to the signals provided by buffer 18. Upon a change in signal *WE switching from a logic low to a logic high, a standard specification in the industry, known as write high to data don't care (TWHDX), requires that signal D also be allowed to change without any adverse effect such as writing invalid data into a cell. Before invalid data could be written into a memory cell, the invalid data must first propagate through the write circuitry. The last stage of the write circuitry is typically called a write driver. One of the signals generated by buffer 18 in response to signal *WE is a write driver enable signal WDE. Signal WDE is generated at a logic high when memory 10 is in the write mode and at logic low when memory 10 is in the read mode. Signal WDE enables the write driver at logic high and disables the write driver at a logic low. Consequently, if write driver enable signal WDE received by data I/0 is switched to a logic low before the invalid data reaches the write driver, the invalid data is prevented from reaching a memory cell. In order to ensure this, however, the propagation delay through the write circuitry must be ensured of being at least long enough for signal WDE to reach the write driver of data I/O 17.

A better technique, shown in FIG. 1, uses a pulse, pulse *CDP, to disable column decoder 14 in response to a write mode to read mode transition. Of course the write driver must still be disabled so that sensing can occur. Disabling the column decoder takes advantage of the propagation delay through the write circuitry of data I/0 17 to the column decoder being longer than the propagation delay to the write driver. Pulse *CDP is generated very quickly with a minimum of delay. Transition summation circuit 21 combines only two signals so has very little propagation delay. The important transition is the logic low to logic high transition of signal *WE. Transition detection circuitry can generally be optimized for either a rising edge or a falling edge. Transition detector 19 can easily be made for rapid detection of the logic low to logic high transition of signal *WE. Accordingly, pulse *CDP can be generated at least as quickly as signal WDE can be switched from a logic high to a logic low. Signal *CDP disconnects the write path at a point in the write path which has a greater propagation delay than the point at which signal WDE disconnects the write path. This provides an opportunity to remove some of the delay from the write circuitry which has been required in the past to ensure meeting the write high to data don't care specification. Consequently, data I/O 17 can write faster because the required delay in the write circuitry is reduced.

Another advantageous aspect of the quick disabling of the column decoder is that the bit line pairs are isolated from data lines 16 before the bit line pairs begin being equalized after a write. This prevents data lines 16 from loading bit line equalization circuit 15.

Figure 2:
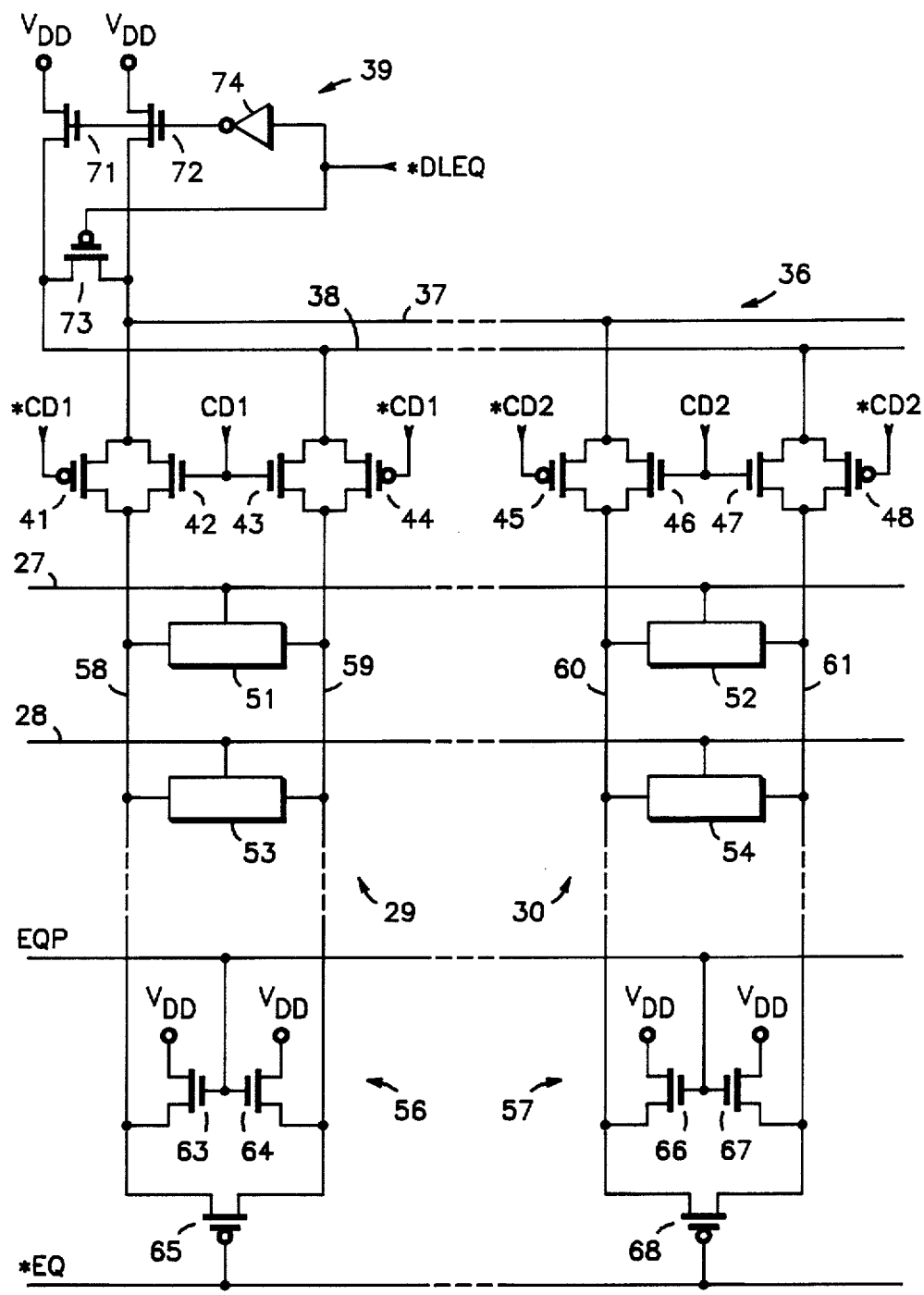
FIG. 2 is a circuit diagram of a portion of the memory of FIG. 1 according to a preferred embodiment of the invention.

Shown in FIG. 2 is a portion of array 11, a portion of column decoder 14, a portion of data lines 16, and a portion of bit line equalization circuit 15. The portion of data lines 16 shown in FIG. 2 is a data line pair 36 comprised of a data line 37, a data line 38, and an equalization circuit 39. Equalization circuit 39 is comprised of N channel transistors 71 and 72, a P channel transistor 73, and a CMOS inverter 74. The portion of column decoder 14 shown in FIG. 2 is comprised of coupling transistors 41, 42, 43, 44, 45, 46, 47, and 48. The portion of array 11 shown in FIG. 2 is comprised of word lines 27 and 28, bit line pairs 29 and 30, a memory cell 51 coupled to word line 27 and bit line pair 29, a memory cell 52 coupled to word line 27 and bit line pair 30, a memory cell 53 coupled to word line 28 and bit line pair 29, a memory cell 54 coupled to word line 28 and bit line pair 30, an equalization circuit 56 coupled to bit line pair 29, and an equalization circuit 57 coupled to bit line pair 30. Bit line pair 29 is comprised of bit lines 58 and 59. Bit line pair 30 is comprised of bit lines 60 and 61. Equalization circuit 56 is comprised of N channel transistors 63 and 64 and a P channel transistor 65. Equalization circuit 57 is comprised of N channel transistors 66 and 67 and P channel transistor 68. The N channel transistors are N channel, enhancement mode, insulated gate field effect transistors. The P channel transistors are P channel, enhancement mode, field effect transistors. The threshold voltage is about 0.6 volt for the N channel transistors and about −0.6 volt for the P channel transistors. In the case of the N channel transistors, the threshold voltage increases to about 1.0 volt when the source reaches 3-4 volts due to the well known body effect. Equalization circuit 39 is comprised of N channel transistors 71 and 72, P channel transistor 73, and inverter 74.

Transistor 42 is an N channel transistor having a first current electrode connected to data line 37, a second current electrode coupled to bit line 58, and a control electrode for receiving a column decoder output signal CD1. Transistor 43 is an N channel transistor having a first current electrode connected to data line 38, a second current electrode coupled to bit line 59, and a control electrode for receiving column decoder output signal CD1. Transistor 46 is an N chanrel transistor having a first current electrode connected to data line 37, a second current electrode coupled to bit line 60, and a control electrode for receiving a column decoder output signal CD2. Transistor 47 is an N channel transistor having a first current electrode connected to data line 38, a second current electrode coupled to bit line 61, and a control electrode for receiving column decoder output signal CD2. Transistor 41 is a P channel transistor having a first current electrode connected to data line 37, a second current electrode coupled to bit line 58, and a control electrcde for receiving a column decoder output signal *CD1 which is complementary to signal CD1. Transistor 44 is a P channel transistor having a first current electrode connected to data line 38, a second current electrode coupled to bit line 59, and a control electrode for receiving column decoder output signal *CD1. Transistor 45 is a P channel transistor having a first current electrode connected to data line 37, a second current electrode coupled to bit line 60, and a control electrode for receiving a column decoder output signal *CD2 which is complementary to signal CD2. Transistor 48 is a P channel transistor having a first current electrode connected to data line 38, a second current electrode coupled to bit line 61, and a control electrode for receiving column decoder output signal *CD2.

Transistor 63 has a first current electrode coupled to a positive power supply terminal VDD for receiving, for example, 5 volts, a second current electrode coupled to bit line 58, and a control electrode for receiving an equalization precharge signal EQP. Transistor 64 has a first current electrode coupled to VDD, a second current electrode coupled to bit line 59, and a control electrode for receiving signal EQP. Transistor 65 has a first current electrode coupled to bit line 58, a second current electrode coupled to bit line 59, and a control electrode for receiving a bit line equalization signal *EQ. Transistor 66 has a first current electrode coupled to a positive power supply terminal VDD, a second current electrode coupled to bit line 60, and a control electrode for receiving an equalization precharge signal EQP. Transistor 67 has a first current electrode coupled to VDD, a second current electrode coupled to bit line 61, and a control electrode for receiving signal EQP. Transistor 68 has a first current electrode coupled to bit line 60, a second current electrode coupled to bit line 61, and a control electrode for receiving a bit line equalization signal *EQ. Inverter 74 has an input for receiving signal *DLEQ, and an output. Transistor 71 has a first current electrode coupled to VDD, a second current electrode coupled to data line 38, and a control electrode coupled to the output of inverter 74. Transistor 72 has a first current electrode coupled to VDD, a second current electrode coupled to data line 37, and a control electrode coupled to the output of inverter 74. Transistor 73 has a first current electrode coupled to data line 37, a second current electrode coupled to data line 38, and a control electrode for receiving signal *DLEQ.

In a write mode data line pair 36 is polarized and is coupled to one of the bit line pairs in array 11. Assuming that memory cell 51 is selected, signal CD1 is a logic high so that transistors 41-44 are conducting and data line pair 36 is coupled to bit line pair 29. With bit line pair 29 coupled to data line pair 36, the logic states of bit lines 58 and 59 are driven to the same logic states as that present on data lines 37 and 38, respectively. Word line 27 is enabled so that memory cell 51 can receive the logic states present on bit lines 58 and 59. There is a minimum amount of time that the bit lines must be polarized to opposite logic states while word line 27 is enabled to ensure that memory cell 51 is effectively written into. In the read mode, word line 27 is enabled which causes the contents of memory cell 51 to be output onto bit lines 58 and 59. Memory cell 51 causes a voltage differential between bit lines 58 and 59 which is coupled to data lines 37 and 38 via transistors 41-44. The voltage differential is then sensed and interpreted as either a logic high or a logic low and output as such.

During the read mode, signal EQP is held at a voltage which is one N Channel threshold voltage below VDD. If VDD is 5.0 volts, signal EQP is at about 4.0 volts. This ensures that neither bit line 58 nor bit line 59 will drop below two N channel threshold voltages below VDD. Two threshold voltages below VDD would then be about 3.0 volts including body effect. When there is a row address transition during the read mode, signal EQP pulses to VDD for the duration of the logic low pulse width of signal *EQ to bring both bit lines of a bit line pair to one N channel threshold voltage below VDD. Signal *EQ pulses to logic low in response to any row address transition but is otherwise a logic high during a read or write. Circuit 39 equalizes data lines 37 and 38 in response to signal *DLEQ pulsing to a logic low in response to a column address change, a row address change, or a change from the write to the read mode. When signal *DLEQ is a logic low, transistor 73 is conducting and inverter 74 provides a logic high output at VDD which causes data lines 37 and 38 to be equalized at one N channel threshold voltage below VDD, the same as the bit lines.

Figure 3:
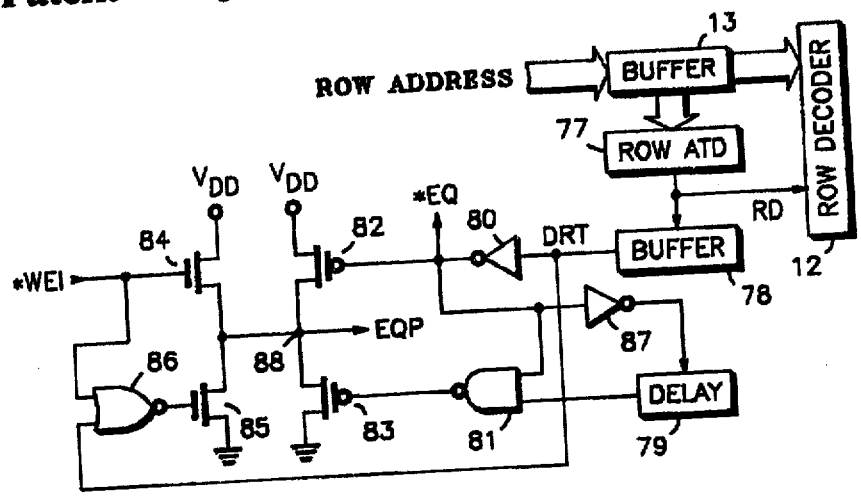
FIG. 3 is combination block, logic, and circuit diagram according to a preferred embodiment of the invention.

Shown in FIG. 3 is row address buffer 13, row decoder 12, and a portion of bit line equalization circuit 15 which generates signals *EQ and EQP which is a control pulse circuit 76. Control pulse circuit 76 is comprised of a row address transition detection and summation circuit 77, a buffer circuit 78, a delay circuit 79, an inverter 80, a NAND gate 81, a P channel transistor 82, a P channel transistor 83, an N channel transistor 84, an N channel transistor 85, and a NOR gate 86, and an inverter 87. Circuit 77 is coupled to row address buffer 13 and provides a row decoder disable signal RD as a logic high pulse in response to any change in the row address. Row decoder 12 receives signal RD and is disabled for the duration of the logic high pulse width of signal RD. Buffer circuit 78 has an input for receiving signal RD, and an output for providing a delayed row address transition signal DRT. Signal DRT is the same as signal RD except that it is delayed about 2 ns due to buffer 78. Inverter 80 has an input for receiving signal DRT, and an output for providing signal *EQ. Inverter 87 has an input connected to the output of inverter 80, and an output. Delay circuit 79 has an input connected to the output of inverter 87, and an output. NAND gate 81 has a first input connected to the output of inverter 80, a second input connected to the output of delay circuit 79. Transistor 82 has a control electrode connected to the output of inverter 80, a first current electrode connected to VDD, and a second current electrode connected to a node 88. Signal EQP is generated at node 88. Transistor 83 has a control electrode connected to the output of NAND gate 81, a first current electrode connected to ground, and a second current electrode connected to node 88. Transistor 84 has a control electrode for receiving signal *WEI, a first current electrode coupled to VDD, and a second current electrode connected to node 88. NOR gate 86 has a first input for receiving signal *WEI, a second input connected to the output of delay buffer 78, and an output. Transistor 85 has a control electrode connected to the output of NOR gate 86, a first current electrode connected to ground, and a second current electrode connected to node 88.

When signal *WEI is a logic high, indicative of the read mode, transistor 84 is conducting. The logic high of signal *WEI also forces NOR gate 86 to output a logic low which causes transistor 85 to be non-conductive. Signal *WEI at a logic high is provided in a conventional CMOS manner so that it is at VDD. Node 88 will tend to be driven to VDD minus the threshold voltage of transistor 84. Transistor 84 will thus tend to drive node 88, and thus signal EQP, to about 4.0 volts for the case in which VDD is at about 5.0 volts. Signal DRT is normally a logic low and only pulses to a logic high in response to a row address transition. When signal DRT is a logic low, inverter 80 provides signal *EQ at a logic high so that transistor 82 is not conducting. Inverter 87 provides a logic low output to delay circuit 79 which in turn provides a logic low output to NAND gate 81. NAND 81 gate thus provides a logic high output which causes transistor 83 to be non-conductive. With transistor 83 non-conductive, there is no current drain from node 88 so that signal EQP is provided at one N channel threshold voltage below VDD.

In response to a row address transition in the read mode, signal RD switches to a logic high for about 10 ns. The delay of buffer circuit 78 is about 2 ns so that signal DRT switches to a logic high about 2 ns after signal RD switches to a logic high and switches to a logic low about 2 ns after signal RD switches to a logic low. Upon signal DRT switching to a logic high, inverter 80 responds by switching its output to a logic low which causes transistor 82 to be conductive. The logic low provided by inverter 80 to NAND gate 81 holds the output of NAND gate 81 at logic high so that transistor 83 remains non-conductive. Signal EQP is then provided at VDD. After the delay time of delay circuit 79, the output of delay 79 becomes a logic high. After signal DRT switches back to a logic low, inverter 80 outputs a logic high which causes transistor 82 to be non-conductive and NAND gate 81 to provide a logic low output for the duration of the delay of delay circuit 79. Transistor 83 responds by becoming conductive which pulls signal EQP down to a little below one threshold voltage below VDD. After the time delay of delay circuit 79, the output of delay circuit 79 switches to a logic low which causes NAND gate 81 to provide a logic high output, causing transistor 83 to become non-conductive. After signal DRT switches to a logic low, it is desirable to release the bit lines to be separated by the enabled memory cell. This is achieved by having transistor 83 reduce the voltage of signal EQP. Transistor 83 is conductive for about the duration of the delay of delay circuit 79 which is sufficient to bring signal EQP to at least one N channel threshold voltage below VDD.

In the write mode, signal *WEI is a logic low which causes transistor 84 to be non-conductive and NOR gate 86 to be responsive to signal DRT. In in the absence of a row address transition, signal DRT is a logic low so that NOR gate outputs a logic high to transistor 85, causing transistor 85 to be conductive. Signal *EQ is a logic high and transistors 82 and 83 are non-conductive when signal DRT is a logic low. Consequently, in the absence of a row address transition, signal EQP is held to a logic low by transistor 85 during the write mode. In response to a row address transition, signal DRT pulses to a logic high which causes signal *EQ to switch to a logic low, transistor 82 to become conductive, and NOR gate 86 to output a logic low pulse of the same duration as the logic high pulse of signal DRT. Transistor 85 responds by becoming non-conductive for this same duration. Signal EQP is thus pulsed to a logic high for the duration of the logic high of signal DRT. The output of NAND gate 81 is held to a logic high for the pulse duration by signal *EQ being a logic low. When signal DRT switches back to a logic low, signal *EQ switches back to a logic high, transistor 82 becomes non-conductive, NOR gate 86 outputs a logic high, transistor 85 becomes conductive, and signal EQP switches to a logic low. The output of NAND gate 81 pulses to a logic low so that transistor 83 is conductive for the duration of the delay of of delay 79. The time that transistor 83 is conductive is concurrent with the time that transistor 85 is concurrent. A row address transition during a write thus causes signal EQP to switch from a logic low at ground to a logic high of VDD for the duration of the logic high pulse of signal DRT.

When signal *WEI switches to a logic high, indicative of switching to the read mode, transistor 84 becomes conductive and transistor 85 becomes non-conductive. This causes signal EQP to rise to one N channel threshold voltage below VDD. Signal EQP then causes half of the bit lines which have enabled memory cells to begin charging toward two N channel threshold voltages below VDD. In the write mode, at least the selected bit line pairs which have been written to a logic low are essentially at ground potential. Also in the write mode, signal EQP is a logic low so that the selected memory cells of the unselected bit lines may bring one of the pair of bit lines lower than is possible during the read mode. Consequently, half of the bit lines which have enabled memory cells will be charged in response to signal EQP reaching one N channel threshold voltage below VDD in response to a write to read mode transition. A row address transition which follows will then cause signal EQP to rise to VDD. The two step rise to VDD reduces the peak current which is drawn from the VDD power supply in order to charge the bit lines to the desired level. Peak current is important because that has a significant effect on power supply and ground noise that is generated by virtue of the particular event which is drawing the current. The amount of charge which is required to obtain the desired voltage on the bit lines is a function of capacitance of the bit lines. For a given amount of time for charging the bit lines to the desired level, the optimum charge rate should be constant. The current is desirably the same throughout the particular charging duration for the lowest peak current. The current is related to the gate to the source voltage of the charging transistor such as transistor 63 of FIG. 2. The two step rise of signal EQP approximates the desired constant current. The first step is for signal EQP to reach one N channel threshold voltage below VDD which causes the bit lines to become partially charged so that when signal EQP reaches VDD in the second step, the gate to source voltage is not as great as it would be if signal EQP switched quickly to its peak voltage as was done in the prior art. Consequently, the peak current is reduced by the two step rise of signal EQP.

Figure 4:
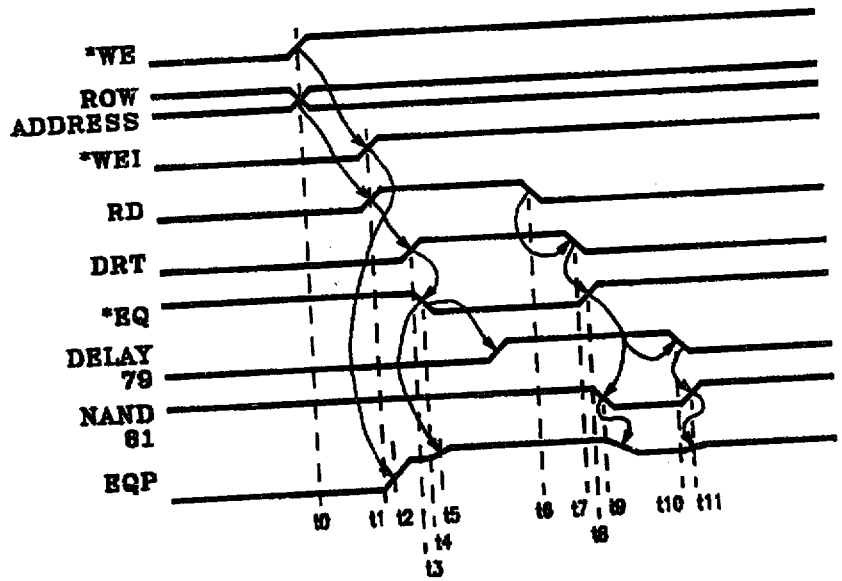
FIG. 4 is a timing diagram useful in understanding the operation of the portion of the memory shown in FIG. 3.

Signal DRT is inherently delayed with respect to signal *WEI which ensures that there is a two step rise even if the row address changes at the same time that signal *WE switches from a logic low to a logic high. Signal EQP which actually brings the bit lines to the final precharge voltage is driven by signal *EQ which is inherently slower than the speed at which signal *WEI can be switched. There is thus essentially no speed penalty in charging the bit lines to the final precharge voltage while reaping the benefits of reduced peak current. Shown in FIG. 4 is a timing diagram for the case in which a row address transition and a write to read transition occur simultaneously.

Signal *WE switches from a logic low to a logic high and the row address changes state at a time t0. Signal *WEI and signal RD respond in about the same amount of time so that both switch to a logic high at a time t1. Signal EQP responds to signal *WEI by rising, at a time t2, to one N channel threshold voltage below VDD. Signal DRT responds to signal RD at a time t3 by rising to a logic high. The time between time t1 and t3 is the time delay of buffer circuit 78. Signal *EQ responds to signal DRT switching to a logic high by switching to a logic low at a time t4. Signal EQP responds to signal *EQ switching to a logic low by switching to VDD at a time t5.

The pulse width of signal DRT is the same as that of signal RD which is at least a predetermined time duration of, for example, 9 ns but can be longer depending on the severity of address skew, if any. Address skew occurs when more than one address signal changes state in which there is some separation in time between the changes. Address skew is well known in the art. After the predetermined time duration signal RD switches back to a logic low at a time t6. Signal DRT is switched back to a logic low by signal RD at a time t7 which causes signal *EQ to switch back to a logic high at a time t8. When signal *EQ switches to a logic high, both inputs to NAND gate 81 are a logic high which causes NAND gate 81 to provide a logic low output at a time t9. The logic low output of NAND gate 81 causes transistor 83 to be conductive so that signal EQP begins dropping toward about 3 volts. After the delay of delay circuit 79, the output of delay circuit 79 becomes a logic high at a time t10 which causes the output of NAND gate 81 to provide a logic high output at a time t11 which causes signal EQP to rise to one threshold voltage below VDD. This is the level of EQP at which sensing occurs.

The bit line voltages are equalized at one threshold voltage below VDD prior to sensing by signal EQP being at VDD. During sensing, EQP is held at one threshold voltage below VDD so that the bit line which is pulled to the lower voltage will tend to be held at about two N channel threshold voltages below VDD. This reduces the amount of precharging which must be achieved to prepare for the next read.

Figure 5:
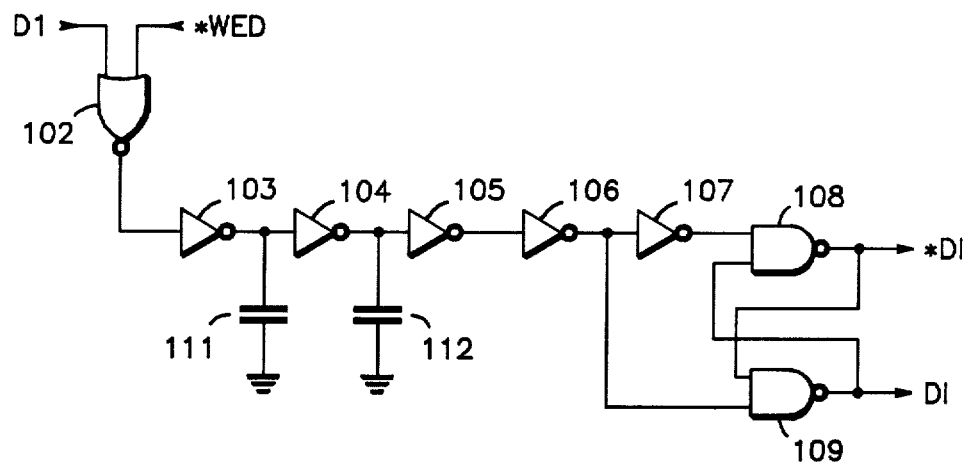
FIG. 5 is a circuit diagram of a data-in buffer used in the memory of FIG. 1.

Shown in FIG. 5 is a data-in buffer 101 which is a portion of the write circuitry of data I/0 17. Data-in buffer 101 is comprised of a NOR gate 102; inverters 103, 104, 105, 106, and 107; NAND gates 108 and 109; and capacitors 111 and 112. There is a data-in buffer such as data-in buffer 101 for each bit of data. If memory 10 were a x8 memory then there would be 8 data-in buffers such as data-in buffer 101. NOR gate 102 has a first input for receiving a data-in write enable signal *WED derived from write enable signal *WE, a second input for receiving a data signal D1 which is a particular signal of data D, and an output. Inverter 103 has an input connected to the output of NOR gate 102, and an output. Capacitor 111 has a first terminal connected to the output of inverter 103 and a second terminal connected to ground. Inverter 104 has an input connected to the output of inverter 103, and an output. Capacitor 112 has a first terminal connected to the output of inverter 104 and a second terminal connected to ground. Inverter 105 has an input connected to the output of inverter 104 and an output. Inverter 106 has an input connected to the output of inverter 105 and an output. Inverter 107 has an input connected to the output of inverter 106 and an output. NAND gate 108 has a first input connected to the output of inverter 107, an output for providing a complementary internal data-in signal *DI, and a second input. NAND gate 109 has a first input connected to the output of inverter 106, a second input connected to the output of NAND gate 10B, and an output connected to the second input of NAND gate 108 and for providing an internal data-in signal DI.

Data-in buffer 101 performs the conventional function of a data-in buffer of providing a pair of complementary signals, signals DI and *DI, representative of the data input signal, signal D1. Capacitors 111 and 112 are conventional except that the amount of capacitance added by capacitors 111 and 112 is less than that normally required. Capacitors 111 and 112 are added to provide some delay in order to meet the write high to data don't care specification. The delay provided is less than that normally provided because of the column decoder being disabled directly in response to a write to read transition. Signals DI and *DI are generated to be representative of the logic state of signal D1 when signal *WED is a logic low which is indicative of the write mode. In the read mode, signal *WED is a logic high which forces signal DI to be a logic high and signal *DI to be a logic low. NAND gates 108 and 109 cause both signals DI and *DI to momentarily both be a logic high for any transition of input data. If signal D1 is a logic low when signal *WED switches to a logic low, which indicates a transition to the write mode, the output of NOR gate 102 will switch to a logic high. This transition to a logic high will cause, via inverters 103-107, the first input of NAND gate 108 to switch to a logic low and the first input or NAND gate 109 to switch to logic high. The logic low on the first input of NAND gate 108 will cause NAND gate to provide a logic high output. NAND gate 109 will continue to provide logic high output until the logic high from NAND gate 108 is received. Consequently, both signals DI and *DI are both momentarily a logic high.

Figure 6:
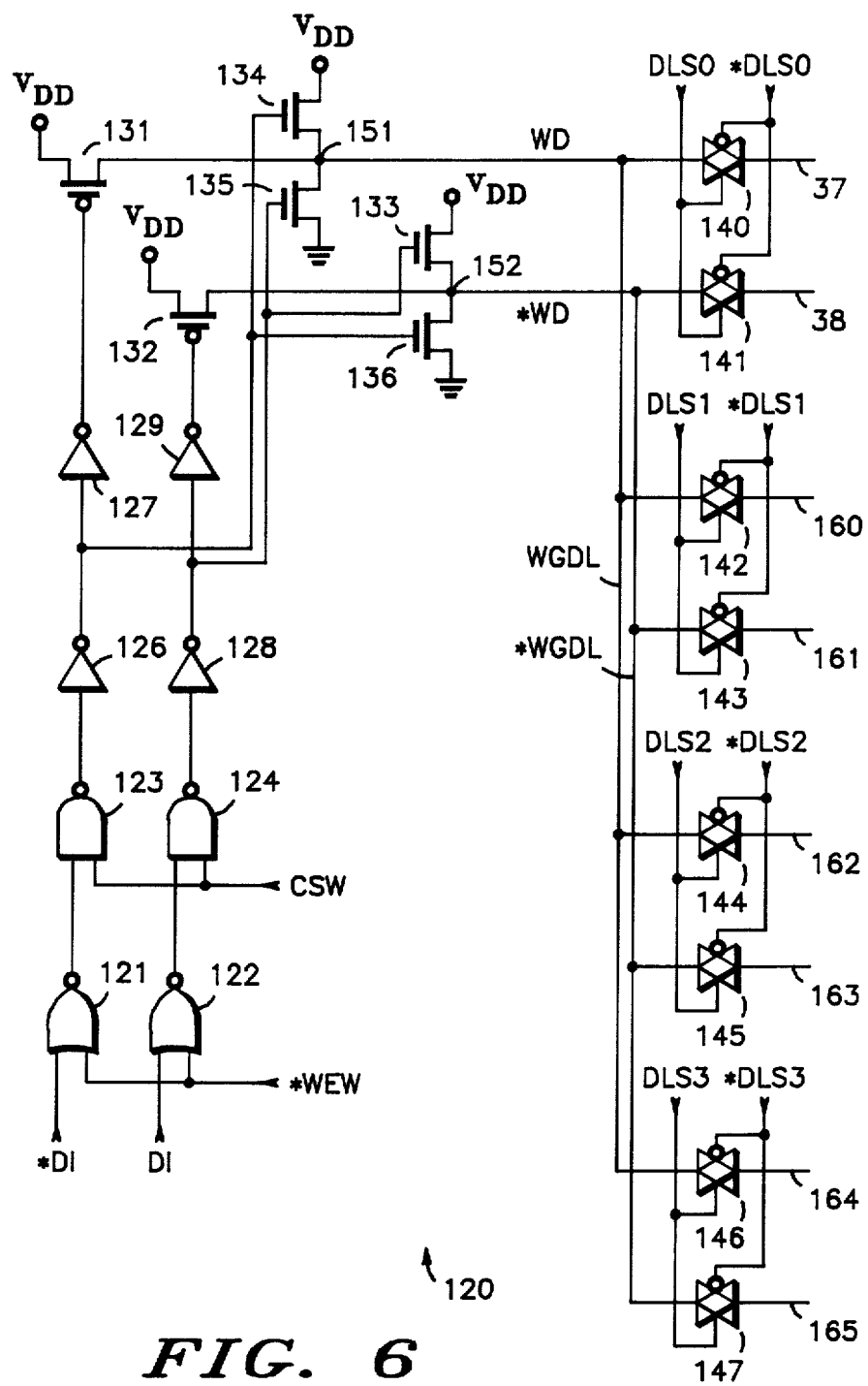
FIG. 6 is a circuit diagram of the write driver according to a preferred embodiment of the invention used in the memory of FIG. 1.

Shown in FIG. 6 is a write driver 120 which is also a portion of the write circuitry of data I/0 17. There is a write driver 120 for each data-in buffer. Write driver 120 is comprised of NOR gates 121 and 122; NAND gates 123 and 124; inverters 126, 127, 128, and 129; P channel transistors 131 and 132; N channel transistors 133, 134, 135, and 136; and transmission gates 140, 141, 142, 143, 144, 145, 146, and 147. NOR gate 121 has a first input for receiving complementary data-in signal *DI, a second input for receiving a write driver write enable signal *WEW derived from write enable signal *WE, and an output. NOR gate 122 has a first input for receiving signal DI, a second input for receiving signal *WEW, and an output. NAND gate 123 has a first input connected to the output of NOR gate 121, a second input for receiving a write enable chip selected signal CSW derived from signal *CS, and an output. NAND gate 124 has a first input connected to the output of NOR gate 122, a second input for receiving signal CSW, and an output. Inverter 126 has an input connected to the output of NAND gate 123, and an output Inverter 127 has an input connected to the output of inverter 126, and an output. Inverter 128 has an input connected to the output of NAND gate 124, and an output. Inverter 129 has an input oonnected to output of inverter 128, and an output. Transistor 131 has a control electrode connected to the output of inverter 127, a first current electrode connected to VDD, and a second current electrode connected to a node 151. Transistor 132 has a control electrode connected to the output of inverter 129, a first current electrode connected to VDD, and a second current electrode connected to a node 152. Transistor 133 has a control electrode connected to the output of inverter 128, a first current electrode connected to VDD, and a second current electrode connected to node 152. Transistor 134 has a control electrode connected to the output of inverter 126, a first current electrode connected to VDD, and a second current electrode connected to node 151. Transistor 135 has a control electrode connected to the output of inverter 128, a first current electrode connected to ground, and a second current electrode connected to node 151. Transistor 136 has a control electrode connected to the output of inverter 126, a first current electrode connected to ground, and a second current electrode connected node 152.

A write driver output signal WD and a complementary write driver output signal *WD are generated at nodes 151 and 152, respectively. Nodes 151 and 152 are connected to write global data lines WGDL and *WGDL, respectively, so that signals WD and *WD are present on write global data lines WGDL and *WGDL, respectively. Transmission gates 140-147 are all conventional CMOS transmission gates formed by parallel-connected P and N channel transistors. An example of such a transmissior. gate is shown in FIG. 2 and is comprised of transistors 41 and 42. An advantageous characteristic of a transmission gate is that both logic highs and logic lows are coupled from input to output without a threshold voltage drop. Consequently, both VDD and ground can be coupled from the input to the output of a transmission gate without incurring a threshold voltage drop. If only an N channel transistor is used for coupling a signal, ground potential can be coupled without incurring a threshold voltage loss but only VDD minus a threshold voltage can be coupled if the gate of the transistor is at VDD. A transmission gate is thus characterized as a switch which is capable of coupling logic signals with substantially no voltage loss. Transmission gates 140-147 have true and complementary control inputs for receiving complementary signals for activating the coupling of a signal from the input to the output. The coupling is activated when the true input is at a logic high and the complementary input is at a logic low. Transmission gates 140-147 are also bilateral in that the input and the output of each are interchangeable. This particular characteristic is not particularly significant for the operation of circuit 120 because circuit 120 only provides outputs via transmission gates 140-147 and does not receive any signals via transmission gates 140-147.

Transmission gate 140 has a signal input connected to write global data line WGDL, a signal output connected to data line 37 which is shown in FIG. 2, a true control input for receiving a data line select signal DLS0 derived from the address and write enable signal *WE, and a complementary control input for receiving a complementary data line select signal *DLS0. Transmission gate 141 has a signal input connected to write global data line *WGDL, a signal output connected to data line 38 which is shown in FIG. 2, a true control input for receiving data line select signal DLSO, and a complementary control input for receiving complementary data line select signal *DLS0. Transmission gate 142 has a signal input connected to line WGDL, a signal output connected to a data line 160, a true control input for receiving a data line select signal DLS1 derived from the address and write enable signal *WE, and a complementary control input for receiving a complementary data line select signal *DLS1. Transmission gate 143 has a signal input connected to line *WGDL, a signal output connected to data line 161, a true control input for receiving data line select signal DLSI, and a complementary control input for receiving complementary data line select signal *DLS1. Transmission gate 144 has a signal input connected to line WGDL, a signal output connected to a data line 162, a true control input for receiving a data line select signal DLS2 derived from the address and write enable signal *WE, and a complementary control input for receiving a complementary data line select signal *DLS2. Transmission gate 145 has a signal input connected to line *WGDL, a signal output connected to data line 163, a true control input for receiving data line select signal DLS2, and a complementary control input for receiving complementary data line select signal *DLS2. Transmission gate 146 has a signal input connected to line WGDL, a signal output connected to a data line 164, a true control input for receiving a data line select signal DLS3 derived from the address and write enable signal *WE, and a complementary control input for receiving a complementary data line select signal *DLS3. Transmission gate 147 has a signal input connected to line *WGDL, a signal output connected to data line 165, a true control input for receiving data line select signal DLS3, and a complementary control input for receiving complementary data line select signal *DLS3.

Data line select signals DLS0–DLS3 are address derived signals which are used to select between subarrays or blocks. The particular portion of the address which is used to select between blocks can be considered either part of the column address or the row address or both or neither. The row address is generally considered the address which determines which word line is enabled. The column address is generally considered the address which determines which bit line pairs are coupled to data line pairs. When a memory is divided into sub-arrays or blocks, the portion of the address which selects among the various blocks can be used both to prevent the enabling of a word line and to prevent the coupling of bit line pairs to data line pairs in the deselected blocks. In that sense then, the portion of the address which selects the block which is to be read from or written into is both a column address and a row address. Alternatively, the portion of the address which selects the blocks can be simply considered a block address from which block select signals are generated which provide the actual prevention of word line enabling and bit line to data line coupling. For purposes of the present discussion, the block select portion of the address will be considered part of the row address.

Figure 7:
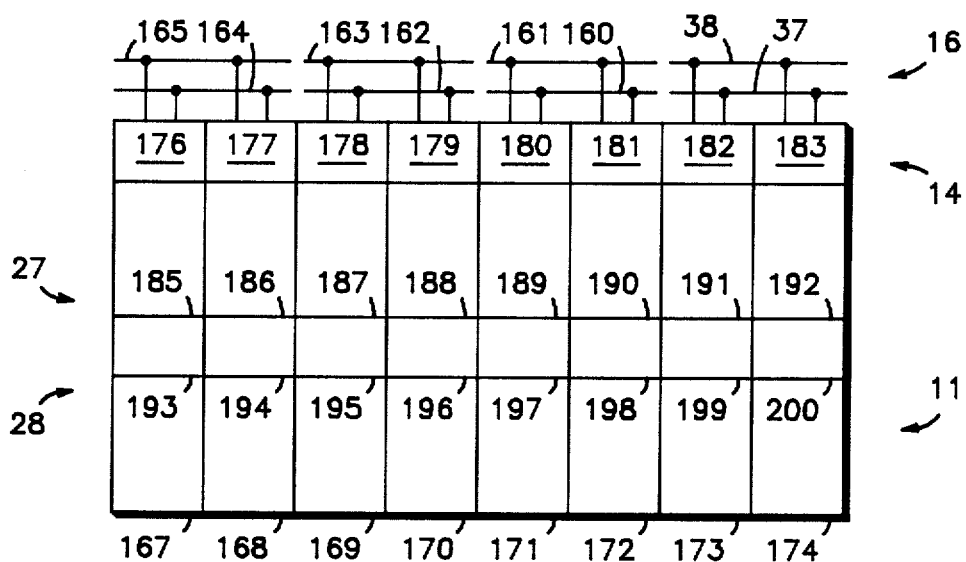
FIG. 7 is a block diagram of a portion of the memory of FIG. 1 useful in understanding the operation of the write driver of FIG. 6.

Shown in FIG. 7 is array 11, column decoder 14, and a portion of data lines 16. Array 11 is comprised of blocks 167, 168, 169, 170, 171, 172, 173, and 174. Column decoder 14 has corresponding column decoder portions 176, 177, 178, 179, 180, 181, 182, and 183, respectively, to blocks 167–174. Word lines 27 and 28 are also shown in FIG. 7. Word line 27 is divided into word line portions 185, 186, 187, 188, 189, 190, 191, and 192. Word line 28 is divided into word line portions 193, 194, 195, 196, 197, 198, 199, and 200. The portion of data lines 16 shown in FIG. 7 are data lines 37, 38, and 160–165 which are the ones shown in FIG. 6. The data lines shown are for carrying one bit of data. Three more sets of data lines, not shown in FIG. 7, comprise the other data lines of data lines 16. When a word line is selected, only the portion which is in the selected block is enabled. For example, if word line 27 is selected and block 167 is selected, only word line portion 185 will be enabled. In such a case, column decoder portion 176 will couple a bit line pair from block 167 to data lines 164 and 165. Each pair of data lines correspond to two blocks. Data line pair 164–165 correspond to blocks 167 and 168, data line pair 162–163 correspond to blocks 169 and 170, data line pair 160–161 correspond to blocks 171 and 172, and data line pair 37–38 correspond to blocks 173–174. The data line pair which corresponds to a selected block is coupled to a bit line pair within that block via the corresponding column decoder.

In the write mode, write global data lines WGDL and *WGDL are coupled to a selected pair of data lines. Assume that block 167 was selected. Column decoder portion 176 couples a selected bit line pair to data lines 164 and 165. Signals DLS3 and *DLS3 indicate that data lines 164 and 165 have been selected by being a logic high and a logic low, respectively. Transmission gates 146 and 147 respond by becoming conductive and couple lines WGDL and *WGDL to data lines 164 and 165, respectively. Consequently, signals WD and *WD are coupled to the selected bit line pair in block 167 with substantially no voltage drop. The selected bit line pair is polarized to a full rail separation. One of the selected bit lines will be written to a logic high of VDD and the other will be written to a logic low of ground. In the prior art, the logic high bit line was written to VDD minus an N channel threshold voltage. This was considered sufficient because in SRAMs there is generally an N channel transistor which couples the bit line to a cross-coupled storage cell. This N channel transistor is enabled by the word line. For each memory cell there are two such N channel transistors, one for each bit line of the bit line pair, enabled by the word line.

In the read mode NOR gate 102 is forced to provide a logic low output by virtue of signal *WED being a logic high during the read mode. With the output of NOR gate 102 at a logic low, signals DI and *DI are provided at a logic high and a logic low, respectively. The outputs of NOR gates 121 and 122 are both forced to provide logic low outputs by virtue of signal *WEW being a logic high in the read mode. With the outputs of NOR gates 121 and 122 at a logic low, both WED gates 123 and 124 are forced to provide logic high outputs. The outputs of NAND gates 123 and 124 are also both forced to a logic high output during chip deselect, the condition in which memory 10 is deselected and signal CSW is provided at a logic low. Inverters 126 and 128 both provide logic low outputs in response to the logic high outputs of NAND gates 123 and 124. Inverters 127 and 129 respond to the logic low outputs of inverters 126 and 128 by providing logic high outputs. The logic low outputs of inverters 126 and 128 also cause transistors 133, 134, 135, and 136 to be non-conductive. The logic high outputs of inverters 127 and 129 cause transistors 131 and 132 to be non-conductive. All of the transistors, transistors 131–136, which drive signals WD and *WD, are non-conductive. Nodes 151 and 152 are thus provided at a high impedance during the read mode or during chip deselect. This is commonly known as the tri-state condition for signals WD and *WD. Also in the read mode, the signals which control the conductivity state of transmission gates 140–147 keep these transmission gates in the non-conductive state. This tri-state condition is also momentarily present in response to signals DI and *DI momentarily being concurrently in the logic high state even in the write mode.

In response to switching from the read mode to the write mode, signals *WED and *WEW switch to a logic low which enables NOR gates 102, 121, and 122 to be responsive to the data inputs, signals D1, *DI, and DI, respectively. Signal CSW is a logic high so that NAND gates 123 and 124 are responsive to the outputs of NOR gates 121 and 122. Assuming signal D1 is a logic high, indicating that a logic high is to be written into the selected memory cell, signals DI and *DI are driven to a logic high and a logic low, respectively. NOR gate 122 responds by providing a logic low output to NAND gate 124 which responds by providing a logic high output to inverter 128. Inverter 128 responds by providing a logic low output. NOR gate 121 responds to the logic low of signal *DI by providing a logic high output to NAND gate 123 which responds by providing a logic low to inverter 126. Inverter 126 provides logic high output to inverter 127 which responds by providing a logic low output.

While inverter 127 is responding to the logic high output of inverter 126, transistors 134 and 136 are also responding by becoming a conductive. Transistor 134 becoming conductive will supply current to node 151 so that signal WD will be driven toward a logic high. Transistor 136 becoming conductive pulls node 152 to ground and thus signal *WED to a logic low. Transistors 132 and 133 remain non-conductive in view of inverter 129 still providing a logic high and inverter 128 providing a logic low as in the chip deselect or read mode which preceded the write mode. Signal *WD is then present as a logic low on line *WGDL. Inverter 127 providing a logic low output causes transistor 131 to become conductive. Transistor 131 in a conductive state brings node 151 all the way to VDD. Transistor 134 can bring node 151 to only one N channel threshold voltage below VDD. Transistor 134 is effective in providing for a very fast rise of signal WD at the beginning of its rise in voltage. At the beginning, transistor 134 has a high gate to source voltage so that transistor 134 is highly conductive. As the voltage on node 151 rises, the gate to source voltage declines so that transistor 134 becomes less conductive. As transistor 134 is becoming less conductive, transistor 131 becomes conductive and aids transistor 134 in raising the voltage on node 151. Consequently, signal WD rises to one N channel threshold voltage below VDD faster than if only one of transistors 131 or 134 were used for providing the logic high output of signal WD. After signal WD reaches one threshold voltage below VDD, transistor 134 becomes non-conductive and transistor 131 continues to drive node 151 until VDD is reached. A selected pair of transmission gates 140-147 provides a low resistance path to the selected data line pair.

If transmission gates 140-147 were replaced by only N channel transistors, there would be some deterioration in the rise time on the selected data line in addition to that caused by the capacitance present on line WGDL. Any node or line which is receiving some signal has some capacitance associated therewith. Line WGDL has some capacitance which must be charged. The data lines also have capacitance as do the bit lines which must be charged and discharged. The charging rate is affected by the resistance of the coupling circuit which couples the signal to the node or line. A greater resistance will cause a greater adverse affect on the rise time. An N channel coupling transistor will have a greater resistance as the signal that it is coupling increases in voltage. Assume that the coupling transistor has VDD coupled to its gate. As the voltage that it is coupling approaches one N channel threshold voltage below VDD, the transistor becomes nearly non-conductive which causes a reduced charging rate of the node or line being charged. The reduced charging rate means that the rate at which the voltage rises is reduced. The ultimate voltage is thus reached more slowly. When the signal reaches one threshold voltage below VDD, the gate to source voltage no longer exceeds one threshold voltage so that the coupling transistor is non-conductive. The ultimate voltage reached is thus one N channel threshold voltage below VDD.

One pair among transmission gates 140-147 is enabled. Assume transmission gates 140 and 141 are the enabled transmission gates. This is achieved by signals DLS0 and *DLSO becoming a logic high and a logic low, respectively. The logic high present on line WGDL is coupled to data line 37 through the low resistance path of transmission gate 140. In the prior art, the coupling between the write driver and the data lines was achieved with only an N channel transistor with the accompanying loss in rise time. The logic low on line *WGDL is coupled to data line 38 via transmission gate 141.

The data lines are coupled to a pair of bit lines via a pair of transmission gates. Assume that bit lines 58 and 59, shown in FIG. 2, are selected. In such case, transistors 41-44 are made conductive by signals CD1 and *CD1 being a logic high and a logic low, respectively. Transistors 41 and 42 form a transmission gate which couples data line 37 to bit line 58. Transistors 43 and 44 form a transmission gate which couples data line 38 to bit line 59. In the present example of data line 37 receiving a logic high from write driver circuit 120, bit line 58 is charged to a logic high also. Because a transmission gate is used to couple the logic high on data line 37 to bit line 58, there is very little loss in rise time. Also the logic high on data line 37 of VDD is coupled as VDD to bit line 58. Bit line 58 is thus charged at a more rapid rate than in the prior art because of improved write driver 120 and the use of transmission gates 138 and 140 between node 151 and data line 37 as well as the use of the transmission gate comprised of transistors 41 and 42. The use of transmission gates between the bit lines and the data lines has been known in the past for optimizing the sensing of data. The advantage of using transmission gates between a full rail write signal and the data lines has not been previously recognized.

The logic low coupled from write driver 120 to data line 38 is coupled to bit line 59 via the transmission gate comprised of transistors 43 and 44. The logic low that is provided on bit line 59 is at ground so that there is full rail separation between bit lines 58 and 59. This results in an improved write speed over that of the prior art.

We claim:

1. A memory having a write mode in which data is written into a selected memory cell via a selected bit line pair, and a read mode in which data is read from a selected memory cell via a selected bit line pair, comprising:
  a plurality of memory cells coupled to word lines and bit line pairs at intersections thereof, each memory cell receiving data from or providing data to the bit line pair to which it is coupled when the word line to which it is coupled is enabled;
  a row decoder, coupled to the word lines, for enabling a selected word line as determined by a row address;
  a column decoder for coupling a data line pair to a selected bit line pair as determined by a column address;
  a first power supply terminal for receiving a first power supply voltage of a first magnitude;
  a second power supply terminal for receiving a second power supply voltage of a second magnitude;
  write driver means, coupled between the first power supply terminal and the second power supply terminal, for providing, in response to the memory switching to the write mode, a first write signal at a voltage of the first magnitude and a second write signal at a voltage of the second magnitude in response to a data input signal being in a first logic state; coupling means coupled between the write driver means and the data lines, for providing a voltage of the first magnitude to a first data line of the data line pair and providing a voltage of the second magnitude to a second data line of the data line pair and coupling means comprising:
  a first transmission gate having a coupling input for receiving the first signal, first and second control inputs for receiving first and second complementary write control signals, and a coupling output coupled to the first data line; and a second transmission gate having a coupling input for receiving the second signal, first and second control inputs for receiving the first and second complementary write control signals, and a coupling output coupled to the second data line.

2. The memory of claim 1 wherein the column decoder comprises:

a plurality of transmission gates, coupled to the data line pair and respective bit line pairs, selectively enabled for coupling a bit line pair selected by the column address to the data line pair.

3. A memory having a write mode in which data is written into a selected memory cell via a selected bit line pair, and a read mode in which data is read from a selected bit line pair, comprising:

a plurality of memory cells coupled to word lines and bit line pairs at intersections thereof, each memory cell receiving data from or providing data to the bit line pair to which it is coupled when the word line to which it is coupled is enabled;

a row decoder, coupled to the word lines, for enabling a selected word line as determined by a row address;

a column decoder for coupling a selected bit line pair to a data line pair as determined by a column address;

write buffer means for providing first and second signals which are complementary to each other in response to a data input signal;

a first inverter having an input for receiving the first signal and an output;

a second inverter having an input for receiving the second signal, and an output;

a first transistor of the first conductivity type having a control electrode for receiving the first signal, a first current electrode coupled to a first power supply terminal, and an output coupled to a first output terminal;

a second transistor of the first conductivity type having a control electrode for receiving the second signal, a first current electrode coupled to the first power supply terminal, and a second current electrode coupled to a second output node;

a third transistor of the first conductivity type having a control electrode for receiving the first signal, a first current electrode coupled to a second power supply terminal, and a second current electrode coupled to the second output node;

a fourth transistor of the first conductivity type having a control electrode for receiving the second signal, a first current electrode coupled to the second power supply terminal, and a second current electrode coupled to the first output node;

a fifth transistor of a second conductivity type having a control electrode coupled to the output of the second inverter, a first current electrode coupled to the first power supply terminal, and an output coupled to the second output terminal;

a sixth transistor of the second conductivity type having a control electrode coupled to the output of the first inverter, a first current electrode coupled to the first power supply terminal, and an output coupled to the first output terminal; and coupling means for coupling the first output node to a first data line of the data line pair and the second output node to a second data line of the data line pair.

4. The memory of claim 3 wherein the coupling means comprises:

a first transmission gate having a coupling input coupled to the first output node, first and second control inputs for receiving first and second complementary write control signals, and a coupling output coupled to the first data line; and a second transmission gate having a coupling input coupled to the second output node, first and second control inputs for receiving the first and second complementary write control signals, and a coupling output coupled to the second data line.

5. The memory of claim 4 wherein the column decoder comprises:

a plurality of transmission gates, coupled to the data line pair and respective bit line pairs, selectively enabled for coupling a bit line pair selected by the column address to the data line pair.

6. A memory having a write mode in which data is written into a selected memory cell via a selected bit line pair, comprising:

a plurality of memory cells coupled to word lines and bit line pairs at intersections thereof, each memory cell receiving data from or providing data to the bit line pair to which it is coupled when the word line to which it is coupled is enabled;

a column decoder for coupling a selected bit line pair to a data line pair as determined by a column address;

write driver means, coupled between the first power supply terminal and the second power supply terminal, for providing, in response to the memory switching to the write mode, a first write signal at a voltage of the first magnitude and a second write signal at a voltage of the second magnitude in response to a data input signal being in a first logic state; coupling means, coupled between the write driver means and the data lines for coupling the first write signal to a first data line of the data line pair at the voltage present on the first power supply terminal and for coupling the second write signal to a second data line of the data line pair at the voltage present on the second power supply terminal; said coupling means comprising:

a first transmissin gate having a coupling input for receiving the first signal, first and second control inputs for receiving first and second complementary write control signals, and a coupling output coupled to the first data line; and a second transmission gate having a coupling input for receiving the second signal, first and second control inputs for receiving the first and second complementary write control signals, and a coupling output coupled to the second data line.

7. The memory of claim 6 wherein the column decoder comprises:

a plurality of transmission gates, coupled to the data line pair and respective bit line pairs, selectively enabled for coupling a bit line pair selected by the column address to the data line pair.

* * * * *